US010389343B2

(12) United States Patent
He (10) Patent No.: US 10,389,343 B2
(45) Date of Patent: Aug. 20, 2019

(54) HIGH SPEED, LOW POWER, ISOLATED BUFFER

(71) Applicant: Chengming He, Chandler, AZ (US)

(72) Inventor: Chengming He, Chandler, AZ (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 14/042,658

(22) Filed: Sep. 30, 2013

(65) Prior Publication Data

US 2015/0091625 A1    Apr. 2, 2015

(51) Int. Cl.
*H03K 17/00* (2006.01)
*H03K 19/00* (2006.01)
*H03K 19/0944* (2006.01)
*H03K 19/173* (2006.01)

(52) U.S. Cl.
CPC ....... *H03K 17/002* (2013.01); *H03K 19/0013* (2013.01); *H03K 19/09448* (2013.01); *H03K 19/1737* (2013.01)

(58) Field of Classification Search
CPC .................................................. H03K 19/0013
USPC ....................................................... 375/351
See application file for complete search history.

(56) References Cited

U.S. PATENT DOCUMENTS

| 5,434,823 | A  | * | 7/1995  | Howard ............... G11C 7/1051 365/189.02 |
| 6,115,760 | A  | * | 9/2000  | Lo ............................ G06F 5/08 710/52 |
| 6,122,683 | A  | * | 9/2000  | Ku et al. ........................ 710/71 |
| 6,329,872 | B1 | * | 12/2001 | Foroudi ........................ 327/541 |
| 6,636,077 | B1 |   | 10/2003 | Chang |
| 7,237,164 | B1 | * | 6/2007  | Katchmart ..................... 714/726 |
| 7,301,396 | B1 | * | 11/2007 | Johnson et al. ............... 330/151 |
| 8,081,024 | B1 | * | 12/2011 | Evans ..................... H03K 5/13 327/175 |
| 2011/0273431 | A1 | * | 11/2011 | Ando et al. ................... 345/212 |
| 2012/0068731 | A1 | * | 3/2012  | Lee .................. H03K 19/00361 326/34 |

* cited by examiner

*Primary Examiner* — Daniel C Puentes
(74) *Attorney, Agent, or Firm* — Tracy Parris (57) ABSTRACT

Methods and apparatuses have been disclosed for a high speed, low power, isolated buffer having architecture and operation that control current flow to minimize coupling and power consumption. Buffer architecture may include one or more of BiCMOS components, an input disabling circuit operated to additionally disable an input circuit when it is also disabled by a selection circuit and a buffer disabling circuit operated to disable the buffer when the input circuit is disabled by the selection circuit. Any one or more of these features may be implemented to improve isolation performance. The selection circuit, input disabling circuit and buffer disabling circuit may be operated by the same control signal.

20 Claims, 4 Drawing Sheets

FIG. 7 ically, the invention relates to high speed, low power, isolated buffers.
HIGH SPEED, LOW POWER, ISOLATED BUFFER

CROSS-REFERENCE TO RELATED APPLICATIONS

This application is related to U.S. patent application Ser. No. 14/042,632, by the same inventor, filed Sep. 30, 2013, entitled "High Speed, Low Power, Isolated Multiplexer," which is a non-provisional, utility patent application hereby incorporated by reference in its entirety for all purposes as if fully set forth herein.

TECHNICAL FIELD

The present invention generally relates to buffers. More particularly, the invention relates to high speed, low power, isolated buffers.

BACKGROUND

A problem with conventional buffers, such as those based on U.S. Pat. No. 6,636,077, entitled, "High Isolation, Low Power High Speed Multiplexer Circuit," is that they fail to meet stringent spur level and phase noise requirements in communication and timing systems, creating a need for a buffer that does meet stringent requirements.

SUMMARY

This Summary is provided to introduce concepts in a simplified form. These concepts are described in greater detail below in the sections entitled Detailed Description Of Illustrative Embodiments, Brief Description of the Drawings, Claims, and in FIGS. 1-7. This Summary is not intended to identify key or essential features of the described or claimed subject matter, nor limit the scope thereof.

Methods and apparatuses are disclosed for a high speed, low power, isolated multiplexer having architecture and operation that control current flow to minimize coupling and power consumption. Multiplexer architecture may include one or more of BiCMOS components, an input disabling circuit operated to additionally disable an input circuit when it is also disabled by a selection circuit, a multiplexer disabling circuit operated to disable a multiplexer when input circuits are disabled by the selection circuit, a buffer having a buffer input disabling circuit operated to additionally disable a buffer input circuit when it is also disabled by a buffer selection circuit and a buffer disabling circuit operated to disable a buffer when the buffer input circuit is disabled by the buffer selection circuit. Any one or more of these features may be implemented to improve isolation performance. The architecture may be operated by a one-hot coding scheme.

Methods and apparatuses are disclosed for a high speed, low power, isolated buffer having architecture and operation that control current flow to minimize coupling and power consumption. Buffer architecture may include one or more of BiCMOS components, an input disabling circuit operated to additionally disable an input circuit when it is also disabled by a selection circuit and a buffer disabling circuit operated to disable the buffer when the input circuit is disabled by the selection circuit. Any one or more of these features may be implemented to improve isolation performance. The selection circuit, input disabling circuit and buffer disabling circuit may be operated by the same control signal.

BRIEF DESCRIPTION OF THE DRAWINGS

The foregoing summary, as well as the following detailed description, is better understood when read in conjunction with the accompanying drawings. The accompanying drawings, which are incorporated herein and form part of the specification, illustrate a plurality of embodiments of the present invention and, together with the description, further serve to explain the principles involved and to enable a person skilled in the relevant art(s) to make and use the disclosed technologies. However, embodiments of the invention are not limited to the specific implementations disclosed herein. Unless expressly indicated, each figure represents a different embodiment and components in each embodiment are intentionally numbered differently compared to potentially similar components in other embodiments.

DETAILED DESCRIPTION OF ILLUSTRATIVE EMBODIMENTS

I. Introduction

Reference will now be made to embodiments of the invention, examples of which are illustrated in the accompanying drawings. While the technology will be described in conjunction with various embodiments, it will be understood that the embodiments are not intended to limit the present technology. On the contrary, the present technology is intended to cover alternatives, modifications, and equivalents, which may be included within the spirit and scope the various embodiments as defined herein, including by the appended claims. In addition, in the following detailed description, numerous specific details are set forth in order to provide a thorough understanding of the present technology. However, the present technology may be practiced without these specific details. In other instances, well known methods, procedures, components, and circuits have not been described in detail as not to unnecessarily obscure aspects of the embodiments presented.

References in the specification to "embodiment," "example," or the like, indicate that the embodiment described may include a particular feature, structure, characteristic or step, but every embodiment may not necessarily include the particular feature, structure, characteristic or step. Moreover, such phrases are not necessarily referring to the same embodiment. Furthermore, when a particular feature, structure, or characteristic is described in connection with an embodiment, it is submitted that it is within the knowledge of one skilled in the art to implement such feature, structure, or characteristic in connection with other embodiments whether or not explicitly described.

Unless specifically stated otherwise, terms such as "sampling," "latching," "determining," "selecting," "storing," "registering," "creating," "including," "comparing," "receiving," "providing," "generating," "associating," and "arranging", or the like, refer to the actions and processes of an electronic device that manipulates and transforms data represented as physical (electronic) quantities within the electronic device. The terms "logic," "function," "step," and the like refer to functionality that may be implemented by hardware (digital and/or analog) or a combination of hardware, software and/or firmware. Unless specifically indicated, described and claimed functionality may be implemented by hardware (digital and/or analog) or a combination of hardware, software and/or firmware. The term "programmable" and the like refer to functionality permitting definition or selection of functionality to vary performance of logic from one embodiment to the next, whether one-time or any number of times such as by reprogrammable functionality.

Certain terms are used throughout the following description and claims to refer to particular system components and configurations. As one skilled in the art will appreciate, various skilled artisans and companies may refer to a component by different names. The discussion of embodiments is not intended to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct electrical connection or though an indirect electrical connection via other devices and connections. Furthermore, the term "information" is intended to refer to any data, instructions, or control sequences that may be communicated between components of a device. For example, if information is sent between two components, data, instructions, control sequences, or any combination thereof may be sent between the two components.

Signal labels beginning with "n" indicate an inverted signal. For example, ns, i.e., not s, is the inverted signal s. Signal ns may be the output of an inverter, also known as a NOT gate, having signal s as an input. A circuit controlled with signals s and ns are essentially controlled with a single control signal, although they may be referred to as first and second control signals that are dependent. Circuits may also be controlled with independent control signals, such as s0, s1, s2 and s3.

II. Exemplary Embodiment of High Speed, Low Power, Isolated Multiplexer

While searching for a solution to the problem of conventional multiplexers failing to meet stringent spur level and phase noise requirements in communication and timing systems, it was discovered that conventional multiplexers, even when input circuits are disabled, permit a degree of coupling, which can be very problematic for high frequency signals and clocks, such as system clocks in a clock distribution network. Coupling degrades signal quality, e.g., by causing undesirable spurs, affecting transition edges and causing phase noise. Conventional multiplexers fail to steer all current to a desired path permitting some leakage current. Also, conventional multiplexers, even "low power multiplexers," consume power unnecessarily because they are unable to turn off current flowing in components. An exemplary multiplexer and buffer having these coupling and/or power consumption problems are shown in U.S. Pat. No. 6,636,077, entitled, "High Isolation, Low Power High Speed Multiplexer Circuit." A multiplexer and buffer without conventional coupling and/or power consumption problems are disclosed herein.

Figure 1:
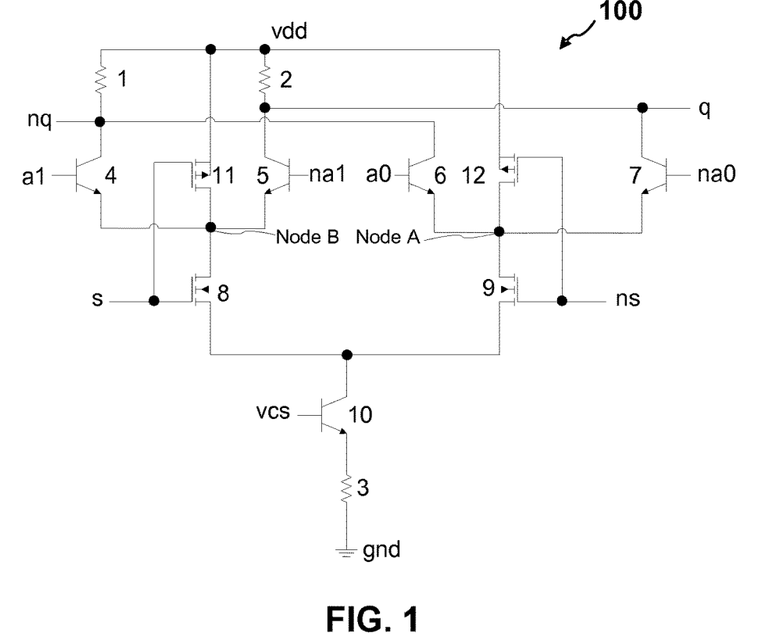
FIG. 1 illustrates a high speed, low power, isolated multiplexer in accordance with an embodiment of the invention.

FIG. 1 illustrates a high speed, low power, isolated multiplexer in accordance with an embodiment of the invention. In this embodiment, multiplexer 100 comprises twelve components labeled 1-12. Other embodiments may have more or fewer components. In various embodiments, components may be discrete or integrated. Also, components and component types may vary between embodiments. Multiplexer 100 is shown with differential inputs and a differential output, although inputs and outputs in other embodiments may be single-ended. In some embodiments, differential inputs and outputs may comprise current mode logic (CML). Multiplexer 100 may be repeated to form a larger multiplexer.

Multiplexer 100 is presented in BiCMOS technology, which is an integration of bipolar junction transistor (BJT) and complementary metal oxide semiconductor (CMOS) technologies. However, other embodiments may implement one technology or mixed technologies, including, but not limited to, BJT, CMOS, heterojunction bipolar transistor (HBT), metal oxide field effect transistor (MOSFET), metal semiconductor field effect transistor (MESFET) or other transconductor or transistor technology. In addition, in various embodiments, transistors can be either single device configuration or multiple device configuration, such as a Darlington configuration. Multiplexer 100 and other embodiments may also be implemented with equivalent circuits. While multiplexer 100 is shown with NPN BJT input circuits, NMOS selection circuits and PMOS disabling circuits, it may also be implemented with PNP BJT input circuits, PMOS selection circuits and NMOS disabling circuits. Disabling circuits, in various embodiments, may stop or suppress intended and/or unintended operation, such as unintended operation due to parasitic capacitance.

Multiplexer 100 comprises a differential output circuit, a first differential input circuit, a second differential input circuit, a first selection circuit, a second selection circuit, a first input disabling circuit, a second input disabling circuit and a current source circuit. The first input circuit and the first selection circuit are coupled in series forming a first series circuit. The first input disabling circuit is coupled in parallel with the first input circuit. Similarly, the second input circuit and the second selection circuit are coupled in series forming a second series circuit. The second input disabling circuit is coupled in parallel with the second input circuit.

The differential output circuit comprises first load resistor 1, second load resistor 2 and differential output Q, NQ, although in other embodiments the differential output circuit may comprise other components in a different configuration. First and second load resistors 1, 2 are coupled between voltage source VDD and differential output Q, NQ.

The first differential input circuit comprises BJT 4 and BJT 5, although in other embodiments the first differential input circuit may comprise other components in a different configuration. BJTs 4 and 5 are npn BJTs. Base nodes of BJTs 4 and 5 receive first differential input signal pair A1, NA1, respectively. A collector node of BJT 4 is coupled to differential output NQ and to first load resistor 1. A collector node of BJT 5 is coupled to differential output Q and to a second load resistor 2. An emitter node of BJT 4 is coupled to Node B. An emitter node of BJT 5 is also coupled to Node B. BJT's 4 and 5 convert first differential input signal pair A1, NA1 from a differential input voltage to a differential output current. First and second load resistors 1, 2 convert the differential output current to a differential output voltage at differential output pair Q, NQ.

The second differential input circuit comprises BJT 6 and BJT 7, although in other embodiments the second differential input circuit may comprise other components in a different configuration. BJTs 6 and 7 are npn BJTs. Base nodes of BJTs 6 and 7 receive second differential input signal pair A0, NA0, respectively. A collector node of BJT 6 is coupled to differential output NQ and to first load resistor 1. A collector node of BJT 7 is coupled to differential output Q and to a second load resistor 2. An emitter node of BJT 6 is coupled to Node A. An emitter node of BJT 7 is also coupled to Node A. BJT's 6 and 7 convert second differential input signal pair A0, NA0 from a differential input voltage to a differential output current. First and second load resistors 1, 2 convert the differential output current to a differential output voltage at differential output pair Q, NQ.

The first selection circuit comprises n-channel MOSFET (NMOS) 8, although in other embodiments the first selection circuit may comprise other components in a different configuration. A gate node of NMOS 8 receives selection signal S. A drain node of NMOS 8 is coupled to node B. A source node of NMOS 8 is coupled to the current source.

The second selection circuit comprises NMOS 9, although in other embodiments the second selection circuit may comprise other components in a different configuration. A gate node of NMOS 9 receives inverted selection signal NS, although in other embodiments a control signal independent of selection signal S may control the second selection circuit. A drain node of NMOS 9 is coupled to node A. A source node of NMOS 9 is coupled to the current source.

The first input disabling circuit comprises p-channel MOSFET (PMOS) 11, although in other embodiments the first input disabling circuit may comprise other components in a different configuration. A gate node of PMOS 11 receives selection signal S. A drain node of PMOS 11 is coupled to node B. A source node of PMOS 11 is coupled to voltage source VDD.

The second input disabling circuit comprises p-channel MOSFET (PMOS) 12, although in other embodiments the second input disabling circuit may comprise other components in a different configuration. A gate node of PMOS 12 receives inverted selection signal NS, although in other embodiments a control signal independent of selection signal S may control the second input disabling circuit. A drain node of PMOS 12 is coupled to node A. A source node of PMOS 12 is coupled to voltage source VDD.

The current source circuit comprises a variable current source consisting of BJT 10 and third resistor 3, although in other embodiments the current source circuit may comprise other components in a different configuration. A base node of BJT 10 is coupled to variable current source (VCS) control signal. A collector node of BJT 10 is coupled to the source nodes of NMOS 8 and NMOS 9. An emitter node of BJT 10 is coupled to third resistor 10. Resistor 10 is coupled between source node of BJT 10 and ground GND.

In this embodiment, the first selection circuit and first disabling circuit are coupled to a first control (e.g. selection signal S) and the second selection circuit and second disabling circuit are coupled to a second control (e.g. inverted selection signal NS).

The first selection circuit (e.g. NMOS 8) enables and disables the first differential input circuit (e.g. BJT 4 and BJT 5) to provide the first input (e.g. first differential input pair A1, NA1) to the differential output Q, NQ. Disabling may include decoupling or creating an open circuit. The first selection circuit couples and decouples the first input circuit from the current source (e.g. BJT 10, third resistor 3), although in other embodiments the first selection circuit may enable and disable a circuit or otherwise select and deselect the first input, whether single-ended, differential, analog or digital, differently.

The second selection circuit (e.g. NMOS 9) enables and disables the second differential input circuit (e.g. BJT 6 and BJT 7) to provide the second input (e.g. second differential input pair A0, NA0) to the differential output Q, NQ. The second selection circuit couples and decouples the second input circuit from the current source (e.g. BJT 10, third resistor 3), although in other embodiments the second selection circuit may enable and disable a circuit or otherwise select and deselect the second input, whether single-ended, differential, analog or digital, differently.

In greater detail, in this particular embodiment, when selection signal S is logic high (i.e. logic 1) and inverted selection signal NS is logic low (i.e. logic 0), current flows through NMOS 8, thereby selecting first differential input A1, NA1 to be provided to differential output Q, NQ. The first differential input operates as a differential buffer. When selection signal S is logic low (i.e. logic 0) and inverted selection signal NS is logic high (i.e. logic 1), current flows through NMOS 9, thereby selecting second differential input A0, NA0 to be provided to differential output Q, NQ. The second differential input operates as a differential buffer. Although multiplexer 100 is a 2:1 multiplexer, any other multiplexer ratio may be realized using technology disclosed herein with appropriate control signals.

In contrast, conventional bipolar multiplexers, such as those based on U.S. Pat. No. 6,636,077, use an npn BJT as a selection switch. Given that saturation occurs at Vbc less than 0.4 Volts, selection control signals cannot eliminate all current flowing from the BJT switches, which limits the level of isolation provided by the multiplexer. An NMOS selection switch (e.g. NMOS 8, NMOS 9) turns off completely when selection control voltage is equal to or less than zero volts and functions as a low voltage switch when activated. NMOS selection switches permit selection control voltage levels to be voltage source VDD (logic high) and ground GND (logic low). As a result of completely turning off, multiplexer 100 has infinite isolation for a direct current (DC) signal, i.e., an input signal having frequency of zero.

At high input signal frequencies, parasitic overlap capacitance in BJTs 4, 5, 6, 7 in first and second differential input circuits reduces isolation for multiplexer 100. First and second input disabling circuits may be added to reduce or eliminate this problem.

The first input disabling circuit (e.g. PMOS 11) additionally disables the first input circuit (e.g. first differential input circuit comprising BJT 4 and BJT 5) that is also disabled by the first selection circuit (e.g. NMOS 8) when selection signal S is logic 0. When selection signal S is logic 0, NMOS 8 decouples the first input circuit from the current source, thereby disabling or deselecting the first input circuit. Disabling may include, for example, locking BJT 4 and BJT 5 in cut-off mode. Given that PMOS 11 is active low, when NMOS 8 is off in response to selection signal S being logic 0, PMOS 11 is on. When PMOS 11 is on, it short-circuits the first input circuit and parasitic overlap capacitance therein by pulling NODE B up to voltage source VDD. This additional disabling of the first input circuit improves the isolation of multiplexer 100.

The second input disabling circuit (e.g. PMOS 12) additionally disables the second input circuit (e.g. second differential input circuit comprising BJT 6 and BJT 7) that is also disabled by the second selection circuit (e.g. NMOS 9) when inverted selection signal NS is logic 0. When inverted selection signal NS is logic 0, NMOS 9 decouples the second input circuit from the current source, thereby disabling or deselecting the second input circuit. Given that PMOS 12 is active low, when NMOS 9 is off in response to inverted selection signal NS being logic 0, PMOS 12 is on. When PMOS 12 is on, it short-circuits the second input circuit and parasitic overlap capacitance therein by pulling NODE A up to voltage source VDD. This additional disabling of the second input circuit improves the isolation of multiplexer 100.

Use of NMOS selection switches (e.g. NMOS 8, NMOS 9) contributes little to noise because they are used as switches in cascade nodes (e.g. NODE A, NODE B). Simulations show isolation at DC is infinite. At 100 MHz input signal frequency, multiplexer 100 provides 20 dB better isolation than a conventional multiplexer based on U.S. Pat. No. 6,636,077. At 1 GHz input signal frequency, multiplexer 100 provides 10 dB better isolation than a conventional multiplexer based on U.S. Pat. No. 6,636,077.

Figure 2:
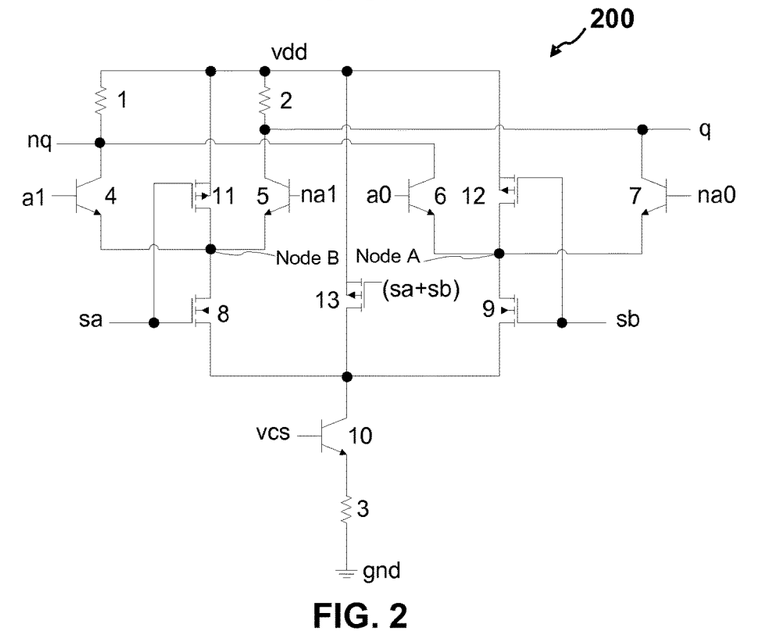
FIG. 2 illustrates a high speed, low power, isolated multiplexer having a multiplexer disabling circuit in accordance with an embodiment of the invention.

FIG. 2 illustrates a high speed, low power, isolated multiplexer having a multiplexer disabling circuit in accordance with an embodiment of the invention. Multiplexer 200 comprises a differential output circuit, a first differential input circuit, a second differential input circuit, a first selection circuit, a second selection circuit, a first input disabling circuit, a second input disabling circuit, a current source circuit and a multiplexer disabling circuit. The first input circuit and the first selection circuit are coupled in series forming a first series circuit. The first input disabling circuit is coupled in parallel with the first input circuit. Similarly, the second input circuit and the second selection circuit are coupled in series forming a second series circuit. The second input disabling circuit is coupled in parallel with the second input circuit. Additionally, the multiplexer disabling circuit is coupled in parallel with the first and second series circuits.

Multiplexer 200 represents multiplexer 100 with the addition of a multiplexer disabling circuit comprising PMOS 13 and with independent first and second input selection control signals SA, SB. Independent first and second input selection control signals SA, SB can simultaneously be logic high or logic low. Accordingly, the first and second input circuits can simultaneously be disabled or deselected by independent first and second input selection control signals SA, SB to permit multiplexer 200 to be shut down or disabled. In doing so, when first and second input circuits are disabled, current source BJT 10 should be maintained in a non-saturation region, which may be accomplished by the multiplexer disabling circuit.

The multiplexer disabling circuit comprises PMOS 13, although in other embodiments the multiplexer disabling circuit may comprise other components in a different configuration. A gate node of PMOS 13 receives independent first and second input selection control signals SA, SB, with logic being SA+SB. For example, independent first and second input selection control signals SA, SB are provided to an OR gate (not shown), the output of which is provided to the gate node of PMOS 13. A drain node of PMOS 13 is coupled to the current source. A source node of PMOS 13 is coupled to voltage source VDD.

The multiplexer disabling circuit (e.g. PMOS 13) disables multiplexer 200. In this embodiment, multiplexer disabling circuit additionally disables the first and second input that are also disabled by the first and second selection circuits and by the first and second input disabling circuits. Given that PMOS 13 is active low, only when both independent first and second input selection control signals SA, SB are logic 0 will PMOS 13 be on. When PMOS 13 is on, it short-circuits the first series circuit formed by the first input circuit and first selection circuit and the second series circuit formed by the second input circuit and second selection circuit, including any parasitic overlap capacitance therein. Depending on the implementation, PMOS 13 may pull the collector node of current source BJT 10 up towards voltage source VDD. Also, when PMOS 13 is on, current may be shunted through PMOS 13 to the current source. In some embodiments, PMOS 13 may be a relatively small device. This additional disabling of multiplexer 200 reduces coupling, which improves the isolation of multiplexer 200.

III. Exemplary Embodiment of High Speed, Low Power, Isolated Buffer

Figure 3:
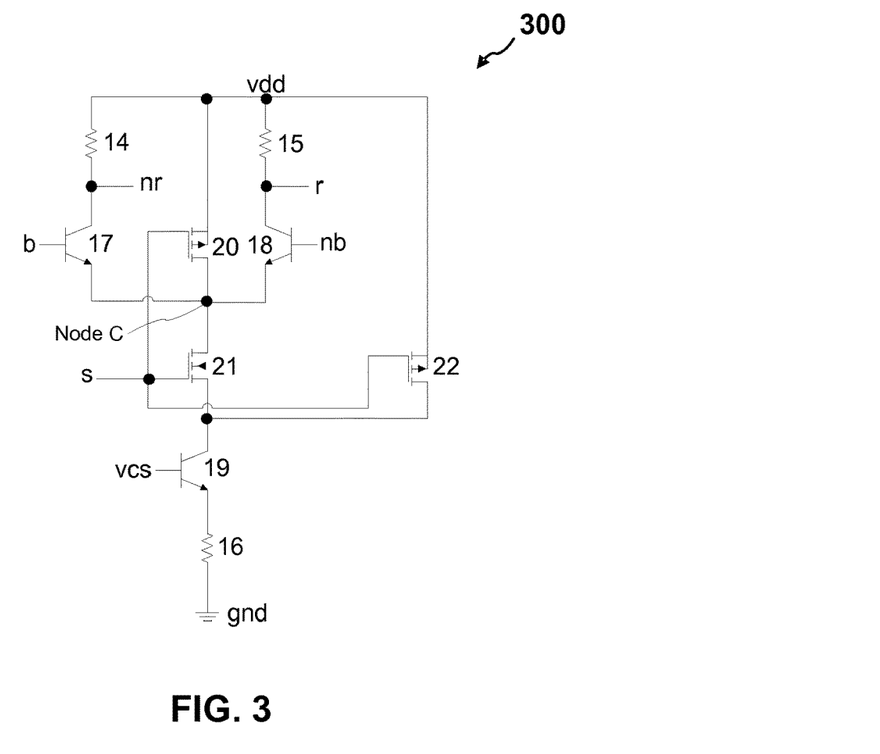
FIG. 3 illustrates a high speed, low power, isolated buffer having a buffer disabling circuit in accordance with an embodiment of the invention.

One or more features of the technology disclosed herein may be implemented in a buffer used in conjunction with or integrated in a multiplexer or implemented alone or with other circuitry besides a multiplexer. FIG. 3 illustrates a high speed, low power, isolated buffer having a buffer disabling circuit in accordance with an embodiment of the invention.

While searching for a solution to the problem of conventional multiplexers failing to meet stringent spur level and phase noise requirements in communication and timing systems, it was discovered that, like conventional multiplexers, conventional buffers, even when input circuits are disabled, permit a degree of coupling, which can be very problematic for high frequency signals and clocks, such as system clocks in a clock distribution network. Coupling degrades signal quality, e.g., by causing undesirable spurs, affecting transition edges and causing phase noise for signals in buffers. Conventional buffers fail to steer all current to a desired path permitting some leakage current. Also, conventional buffers consume power unnecessarily because they are unable to turn off current flowing in components. An exemplary buffer having these coupling and/or power consumption problems is shown in U.S. Pat. No. 6,636,077, entitled, "High Isolation, Low Power High Speed Multiplexer Circuit." A buffer without conventional coupling and/or power consumption problems is disclosed herein.

FIG. 3 illustrates a high speed, low power, isolated buffer having a buffer disabling circuit in accordance with an embodiment of the invention. In this embodiment, buffer 300 comprises nine components labeled 14-22. Other embodiments may have more or fewer components. In various embodiments, components may be discrete or integrated. Also, components and component types may vary between embodiments. Buffer 300 is shown with differential inputs and a differential output, although inputs and outputs in other embodiments may be single-ended. In some embodiments, differential inputs and outputs may comprise CML.

Buffer 300 may be repeated to form a larger buffer. It may be observed that multiplexer 100 and multiplexer 200 are configured with two buffers (e.g. two of buffer 300). Multiplexer 300 implements the buffer disabling circuit as a the multiplexer disabling circuit in common with both buffers. Of course, other configurations may be implemented in other embodiments.

Buffer 300 is presented in BiCMOS technology. However, other embodiments may implement one technology or mixed technologies, including, but not limited to, BJT, CMOS, HBT, MOSFET, MESFET or other transconductor or transistor technology. In addition, in various embodiments, transistors can be either single device configuration or multiple device configuration, such as a Darlington configuration. Buffer 300 and other embodiments may also be implemented with equivalent circuits. While buffer 300 is shown with an NPN BJT input circuit, NMOS selection circuit and PMOS disabling circuits, it may also be implemented with a PNP BJT input circuit, PMOS selection circuit and NMOS disabling circuits. Disabling circuits, in various embodiments, may stop or suppress intended and/or unintended operation, such as unintended operation or coupling due to parasitic capacitance.

Buffer 300 comprises a differential output circuit, a differential input circuit, a selection circuit, an input disabling circuit, a current source circuit and a buffer disabling circuit. The input circuit and the selection circuit are coupled in series forming a series circuit. The input disabling circuit is coupled in parallel with the input circuit. Additionally, the buffer disabling circuit is coupled in parallel with the series circuit.

The differential output circuit comprises first load resistor 14, second load resistor 15 and differential output R, NR, although in other embodiments the differential output circuit may comprise other components in a different configuration. First and second load resistors 14, 15 are coupled between voltage source VDD and differential output R, NR.

The differential input circuit comprises BJT 17 and BJT 18, although in other embodiments the differential input circuit may comprise other components in a different configuration. BJTs 17 and 18 are npn BJTs. Base nodes of BJTs 17 and 18 receive first differential input pair B, NB, respectively. A collector node of BJT 17 is coupled to differential output NR and to first load resistor 14. A collector node of BJT 18 is coupled to differential output R and to a second load resistor 15. An emitter node of BJT 17 is coupled to Node C. An emitter node of BJT 18 is also coupled to Node C. BJT's 17 and 18 convert first differential input signal pair B, NB from a differential input voltage to a differential output current. First and second load resistors 14, 15 convert the differential output current to a differential output voltage at differential output pair R, NR.

The selection circuit comprises NMOS 21, although in other embodiments the selection circuit may comprise other components in a different configuration. A gate node of NMOS 21 receives selection signal S. A drain node of NMOS 21 is coupled to node C. A source node of NMOS 21 is coupled to the current source.

The input disabling circuit comprises PMOS 20, although in other embodiments the input disabling circuit may comprise other components in a different configuration. A gate node of PMOS 20 receives selection signal S. A drain node of PMOS 20 is coupled to node C. A source node of PMOS 20 is coupled to voltage source VDD.

The current source circuit comprises a variable current source consisting of BJT 19 and third resistor 16, although in other embodiments the current source circuit may comprise other components in a different configuration. A base node of BJT 19 is coupled to variable current source (VCS) control signal. A collector node of BJT 19 is coupled to the source node of NMOS 21. An emitter node of BJT 19 is coupled to third resistor 16. Resistor 16 is coupled between source node of BJT 19 and ground GND.

The buffer disabling circuit comprises PMOS 22, although in other embodiments the buffer disabling circuit may comprise other components in a different configuration. A gate node of PMOS 22 receives selection signal S, although in other embodiments a control signal other than selection signal S may control the buffer disabling circuit. A drain node of PMOS 22 is coupled to the current source. A source node of PMOS 22 is coupled to voltage source VDD.

The selection circuit (e.g. NMOS 21) enables and disables the differential input circuit (e.g. BJT 17 and BJT 18) to provide the first input (e.g. first differential input pair B, NB) to the differential output R, NR. Disabling may include decoupling or creating an open circuit or otherwise preventing differential input B, NB from being provided to differential output R, NR. The selection circuit couples and decouples the input circuit from the current source (e.g. BJT 19, third resistor 16), although in other embodiments the selection circuit may enable and disable a circuit or otherwise select and deselect the input, whether single-ended, differential, analog or digital, differently.

In greater detail, in this particular embodiment, when selection signal S is logic high (i.e. logic 1), current flows through NMOS 21, thereby selecting differential input B, NB to be provided to differential output R, NR. When selection signal S is logic low (i.e. logic 0) no current flows through NMOS 21, thereby preventing differential input B, NB from being provided to differential output R, NR.

In contrast, conventional bipolar buffers, such as those based on U.S. Pat. No. 6,636,077, use an npn BJT as a selection switch. Given that saturation occurs at Vbc less than 0.4 Volts, selection control signals cannot eliminate all current flowing from the BJT switch, which limits the level of isolation provided by the buffer. An NMOS selection switch (e.g. NMOS 21) turns off completely when selection control voltage is equal to or less than zero volts and functions as a low voltage switch when activated. NMOS selection switches permit selection control voltage levels to be voltage source VDD (logic high) and ground GND (logic low). As a result of completely turning off, buffer 300 has infinite isolation for a DC signal.

At high input signal frequencies, parasitic overlap capacitance in BJTs 17 and 18 in the differential input circuit reduces isolation for buffer 300. The input disabling circuit may be added to reduce or eliminate this problem.

The input disabling circuit (e.g. PMOS 20) additionally disables the input circuit (e.g. differential input circuit comprising BJT 17 and BJT 18) that is also disabled by the selection circuit (e.g. NMOS 21) when selection signal S is logic 0. When selection signal S is logic 0, NMOS 21 decouples the input circuit from the current source, thereby disabling or deselecting the input circuit. Given that PMOS 20 is active low, when NMOS 21 is off in response to selection signal S being logic 0, PMOS 20 is on. When PMOS 20 is on, it short-circuits the input circuit and parasitic overlap capacitance therein by pulling NODE C up to voltage source VDD. This additional disabling of the input circuit improves the isolation of buffer 300.

The buffer disabling circuit permits buffer 300 to be shut down or disabled. In doing so, when the input circuit is disabled, current source BJT 19 should be maintained in a non-saturation region, which may be accomplished by the buffer disabling circuit.

The buffer disabling circuit (e.g. PMOS 22) disables buffer 300. In this embodiment, buffer disabling circuit additionally disables the input circuit that is also disabled by the selection circuits and by the input disabling circuits. Given that PMOS 22 is active low, when input selection control signal S is logic 0 PMOS 22 will be on. When PMOS 22 is on, it short-circuits the series circuit formed by the input circuit and selection circuit, including any parasitic overlap capacitance therein. Depending on the implementation, PMOS 22 may pull the collector node of current source BJT 19 up towards voltage source VDD. Also, when PMOS 22 is on, current may be shunted through PMOS 22 to the current source. In some embodiments, PMOS 22 may be a relatively small device. This additional disabling of buffer 300 reduces coupling, which improves the isolation of buffer 300.

Figure 4:
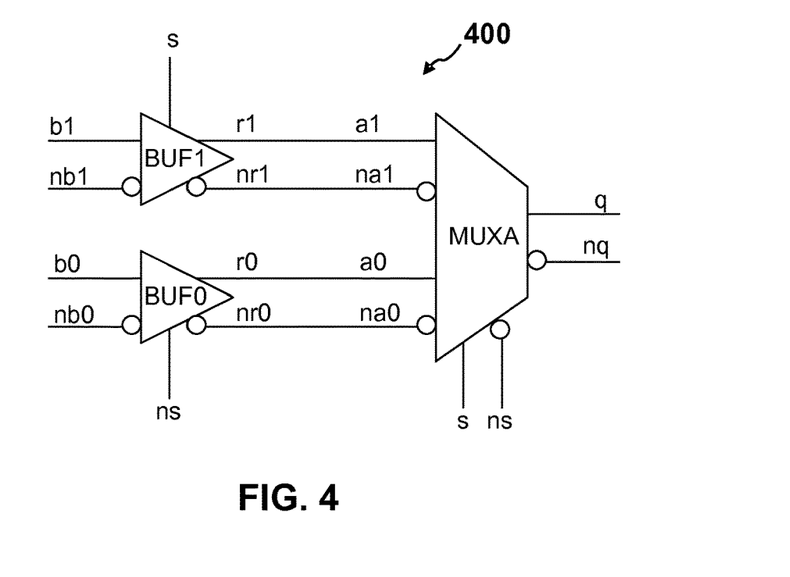
FIG. 4 illustrates a high speed, low power, isolated, buffered 2:1 multiplexer in accordance with an embodiment of the invention.

IV. Exemplary Embodiment of High Speed, Low Power, Isolated, Buffered Multiplexer FIG. 4 illustrates a high speed, low power, isolated, buffered 2:1 multiplexer in accordance with an embodiment of the invention. Buffered multiplexer 400 comprises first buffer BUF1, second buffer BUF0 and first multiplexer MUXA. Although components illustrated in FIG. 4 are differential, other embodiments may comprise single ended buffers and multiplexers.

First buffer BUF1 may comprise, for example, buffer 300, which can be disabled or shut down. Second Buffer may comprise, for example, buffer 300, which can be disabled or shut down. First multiplexer may comprise, for example, multiplexer 100 or multiplexer 200 that can be disabled or shut down. Other embodiments may combine any one or more of multiplexer 100, multiplexer 200, buffer 300, their equivalents or one of many other embodiments falling within the scope of the disclosed technology. The disclosed technology may be combined with conventional technology for improved performance.

First buffer BUF1 input/output includes first buffer input pair B1, NB1, first buffer output pair R1, NR1 and first selection control signal S. Second buffer BUF0 input/output includes second buffer input pair B0, NB0, second buffer output pair R0, NR0 and second selection control signal NS. In other embodiments, first and second selection control signals may be independent of one another, e.g., as opposed to one being dependent on the other as its inverse.

First multiplexer MUXA input/output includes first mux input pair A1, NA1, second mux input pair A0, NA0, first mux output pair Q, NQ and first and second selection signals S, NS. First mux input pair A1, NA1 is coupled to first buffer output pair R1, NR1. Second mux input pair A0, NA0 is coupled to second buffer output pair R0, NR0. Together, first buffer BUF1, second buffer BUF0 and first multiplexer MUXA create a 2:1 buffered multiplexer. Other multiplexer ratios may be created in other embodiments.

In operation, when first selection signal S is logic high and second selection signal NS is logic low, first buffer BUF1 provides first buffer input pair B1, NB1 to first buffer output pair R1, NR1. First mux input pair A1, NA1 receives first buffer output pair R1, NR1. Given that first selection signal S is logic high, first multiplexer MUXA provides first mux input pair A1, NA1 to first mux output pair Q, NQ. With second selection signal NS being logic low, second buffer BUF0 and the multiplexer circuit coupled to second mux input pair A0, NA0 may be disabled as described with respect to one or more disabling techniques for multiplexer 100, multiplexer 200 and buffer 300. Thus, first buffer input pair B1, NB1 is provided to first mux output pair Q, NQ.

When second selection signal NS is logic high and first selection signal S is logic low, second buffer BUF0 provides second buffer input pair B0, NB0 to second buffer output pair R0, NR0. Second mux input pair A0, NA0 receives second buffer output pair R0, NR0. Given that second selection signal NS is logic high, first multiplexer MUXA provides second mux input pair A0, NA0 to first mux output pair Q, NQ. With first selection signal S being logic low, first buffer BUF1 and the multiplexer circuit coupled to first mux input pair A1, NA1 may be disabled as described with respect to one or more disabling techniques for multiplexer 100, multiplexer 200 and buffer 300. Thus, second buffer input pair B0, NB0 is provided to first mux output pair Q, NQ.

An advantage of the circuit shown in FIG. 4 is that isolation of first multiplexer MUXA may be substantially improved for high frequency input signals by buffering inputs to first multiplexer MUXA with isolated buffers that can be disabled or shut down. Cascading one or more isolated buffers with one or more isolated multiplexers provides cumulative isolation. For example, simulations show that multiplexer isolation for a 1 GHz input signal may be improved by more than 40 dB by cascading an isolated buffer with the isolated multiplexer.

In alternative embodiments, first and second buffers BUF1, BUF2 may be implemented by emitter followers to provide correct level-shifting. Each emitter follower may have a variable or switchable current source similar to the variable current source in buffer 300.

Figure 5:
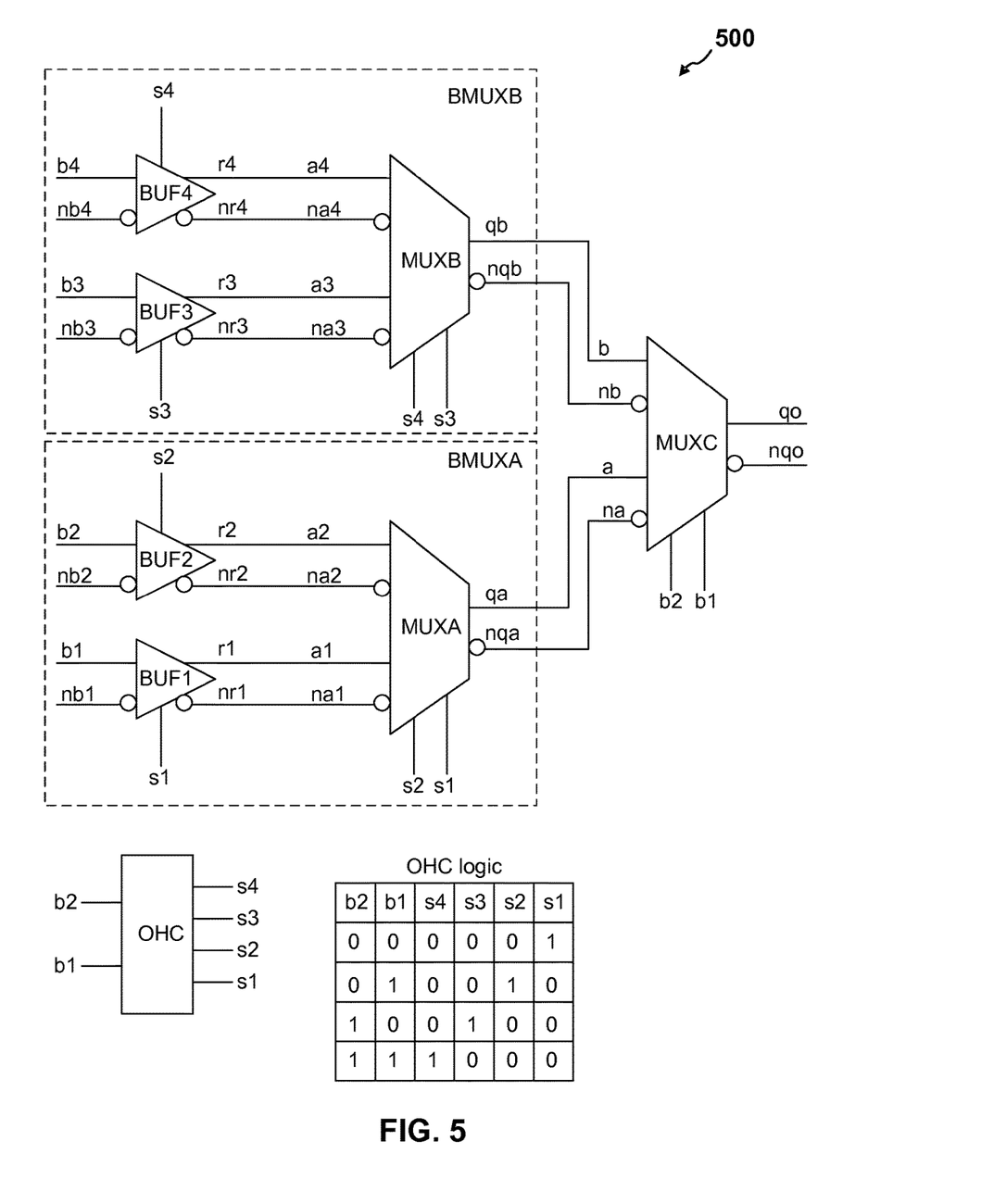
FIG. 5 illustrates a high speed, low power, isolated, buffered 4:1 multiplexer with one-hot coding in accordance with an embodiment of the invention.

FIG. 5 illustrates a high speed, low power, isolated, buffered 4:1 multiplexer with one-hot coding in accordance with an embodiment of the invention. Buffered multiplexer 500 comprises first buffered multiplexer BMUXA, second buffered multiplexer BMUXB and output multiplexer MUXC. Other multiplexer ratios may be implemented in other embodiments. For example, an 8:1 multiplexer may be implemented by scaling up (e.g. doubling the ratio of) first and second buffered multiplexers BMUXA, BMUXB with accompanying signals. Alternatively, an 8:1 multiplexer may be implemented by repeating multiplexer 500 where all buffers and multiplexers may be disabled and coupling the outputs of first and second multiplexer 500 to the input of a new 2:1 output multiplexer.

Although components illustrated in FIG. 5 are differential, other embodiments may comprise single ended buffers and multiplexers. Other embodiments of a buffered multiplexer may combine any one or more of multiplexer 100, multiplexer 200, buffer 300, their equivalents or one of many other embodiments falling within the scope of the disclosed technology. The disclosed technology may be combined with conventional technology for improved performance.

First buffered multiplexer BMUXA comprises first buffer BUF1, second buffer BUF2 and first multiplexer MUXA. Other embodiments may comprise different configurations and multiplexer ratios.

First buffer BUF1 may comprise, for example, buffer 300. First buffer BUF1 input/output includes first buffer input pair B1, NB1, first buffer output pair R1, NR1 and first selection signal S1. In this embodiment, when first selection signal S1 is logic high, first buffer BUF1 is selected and when first selection signal S1 is logic low, first buffer BUF1, in addition to be deselected, is disabled in one or more ways described with respect to buffer 300.

Second buffer BUF2 may comprise, for example, buffer 300. Second buffer BUF2 input/output includes second buffer input pair B2, NB2, second buffer output pair R2, NR2 and second selection signal S2. In this embodiment, when second selection signal S2 is logic high, second buffer BUF2 is selected and when second selection signal S2 is logic low, second buffer BUF2, in addition to be deselected, is disabled in one or more ways described with respect to buffer 300.

First multiplexer MUXA may comprise, for example, multiplexer 100 or multiplexer 200, although in this embodiment first multiplexer MUXA comprises multiplexer 200. First multiplexer MUXA input/output includes first mux input pair A1, NA1, second mux input pair A2, NA2, first mux output pair QA, NQA and first and second selection signals S1, S2. First mux input pair A1, NA1 is coupled to first buffer output pair R1, NR1. Second mux input pair A2, NA2 is coupled to second buffer output pair R2, NR2.

Second buffered multiplexer BMUXB comprises third buffer BUF3, fourth buffer BUF4 and second multiplexer MUXB. Other embodiments may comprise different configurations and multiplexer ratios.

Third buffer BUF3 may comprise, for example, buffer 300. Third buffer BUF3 input/output includes third buffer input pair B3, NB3, third buffer output pair R3, NR3 and third selection signal S3. In this embodiment, when third selection signal S3 is logic high, third buffer BUF3 is selected and when third selection signal S3 is logic low, third buffer BUF3, in addition to be deselected, is disabled in one or more ways described with respect to buffer 300.

Fourth buffer BUF4 may comprise, for example, buffer 300. Fourth buffer BUF4 input/output includes fourth buffer input pair B4, NB4, fourth buffer output pair R4, NR4 and fourth selection signal S4. In this embodiment, when fourth selection signal S4 is logic high, fourth buffer BUF4 is selected and when fourth selection signal S4 is logic low, fourth buffer BUF4, in addition to be deselected, is disabled in one or more ways described with respect to buffer 300.

Second multiplexer MUXB may comprise, for example, multiplexer 100 or multiplexer 200, although in this embodiment second multiplexer MUXB comprises multiplexer 200. Second multiplexer MUXB input/output includes third mux input pair A3, NA3, fourth mux input pair A4, NA4, second mux output pair QB, NQB and third and fourth selection signals S3, S4. Third mux input pair A3, NA3 is coupled to third buffer output pair R3, NR3. Fourth mux input pair A4, NA4 is coupled to fourth buffer output pair R4, NR4.

Output multiplexer MUXC may comprise, for example, multiplexer 100 or multiplexer 200, although in this embodiment output multiplexer MUXC comprises multiplexer 100. Output multiplexer MUXC input/output includes MUXA input pair A, NA, MUXB input pair B, NB, MUXC output pair QO, NQO and first and second MUXC selection signals B1, B2. MUXA input pair A, NA, is coupled to first mux output pair QA, NQA. MUXB input pair B, NB is coupled to second mux output pair QB, NQB.

Exemplary operation of buffered multiplexer 500 with one hot coding (OHC) is shown in FIG. 5 by device OHC and accompanying OHC logic table. OHC logic table shows that first through fourth selection signals S1-S4 are generated from first and second control signals B0, B1. OHC logic table shows that for each binary count of first and second control signals, only one of selection signals S1-S4 are logic high. First and second control signals B0, B1 also select an input to provide to the output of output multiplexer MUXC. For example, second control signal B2, when logic low, may select first buffered multiplexer BMUXA and, when logic high, may select second buffered multiplexer BMUXB. Other embodiments may implement different control and selection logic.

In operation, when first and second control signals B1, B2 are 00, OHC logic table indicates only first selection signal S1 is logic high. As a result, output multiplexer MUXC has selected the output of first buffered multiplexer BMUXA, i.e., first mux output pair QA, NQA, to provide to MUXC output pair QO, NQO. First selection signal S1 selects the output of first buffer BUF1, i.e., first buffer output pair R1, NR1, to provide to first mux output pair QA, NQA. Thus, first buffer BUF1 provides first buffer input pair B1, NB1 to first buffer output pair R1, NR1. First mux input pair A1, NA1 receives first buffer output pair R1, NR1. First multiplexer MUXA provides first mux input pair A1, NA1 to first mux output pair QA, NQA. Output multiplexer MUXC receives first mux output pair QA, NQA at MUXA input pair A, NA and provides it to MUXC output pair QO, NQO.

With second, third and fourth selection signals S2, S3, S4 being logic low, third buffer BUF3, fourth buffer BUF4 and second multiplexer MUXB in second buffered multiplexer BMUXB may be disabled as described with respect to one or more disabling techniques for multiplexer 100, multiplexer 200 and buffer 300. Also, second buffer BUF2 and the second input circuit in first multiplexer MUXA coupled to second mux input pair A2, NA2 may be disabled as described with respect to one or more disabling techniques for multiplexer 100, multiplexer 200 and buffer 300.

Thus, in response to first selection signal S1 being logic high, circuit path(s) is(are) selected or enabled to provide first buffer input pair B1, NB1 to MUXC output pair QO, NQO while other circuit paths are unselected, disabled or shut down to maximize isolation.

When first and second control signals B1, B2 are 01, OHC logic table indicates only second selection signal S2 is logic high. As a result, output multiplexer MUXC has selected the output of first buffered multiplexer BMUXA, i.e., first mux output pair QA, NQA, to provide to MUXC output pair QO, NQO. Second selection signal S2 selects the output of second buffer BUF2, i.e., second buffer output pair R2, NR2, to provide to first mux output pair QA, NQA. Thus, second buffer BUF2 provides second buffer input pair B2, NB2 to second buffer output pair R2, NR2. Second mux input pair A2, NA2 receives second buffer output pair R2, NR2. First multiplexer MUXA provides second mux input pair A2, NA2 to first mux output pair QA, NQA. Output multiplexer MUXC receives first mux output pair QA, NQA at MUXA input pair A, NA and provides it to MUXC output pair QO, NQO.

With first, third and fourth selection signals S1, S3, S4 being logic low, third buffer BUF3, fourth buffer BUF4 and second multiplexer MUXB in second buffered multiplexer BMUXB may be disabled as described with respect to one or more disabling techniques for multiplexer 100, multiplexer 200 and buffer 300. Also, first buffer BUF1 and the first input circuit in first multiplexer MUXA coupled to first mux input pair A1, NA1 may be disabled as described with respect to one or more disabling techniques for multiplexer 100, multiplexer 200 and buffer 300.

Thus, in response to second selection signal S2 being logic high, circuit path(s) is(are) selected or enabled to provide second buffer input pair B2, NB2 to MUXC output pair QO, NQO while other circuit paths are unselected, disabled or shut down to maximize isolation.

When first and second control signals B1, B2 are 10, OHC logic table indicates only third selection signal S3 is logic high. As a result, output multiplexer MUXC has selected the output of second buffered multiplexer BMUXB, i.e., second mux output pair QB, NQB, to provide to MUXC output pair QO, NQO. Third selection signal S3 selects the output of third buffer BUF3, i.e., third buffer output pair R3, NR3, to provide to second mux output pair QB, NQB. Thus, third buffer BUF3 provides third buffer input pair B3, NB3 to third buffer output pair R3, NR3. Third mux input pair A3, NA3 receives third buffer output pair R3, NR3. Second multiplexer MUXB provides third mux input pair A3, NA3 to second mux output pair QB, NQB. Output multiplexer MUXC receives second mux output pair QB, NQB at MUXB input pair B, NB and provides it to MUXC output pair QO, NQO.

With first, second and fourth selection signals S1, S2, S4 being logic low, first buffer BUF1, second buffer BUF2 and first multiplexer MUXA in first buffered multiplexer BMUXA may be disabled as described with respect to one or more disabling techniques for multiplexer 100, multiplexer 200 and buffer 300. Also, fourth buffer BUF4 and the second input circuit in second multiplexer MUXB coupled to fourth mux input pair A4, NA4 may be disabled as described with respect to one or more disabling techniques for multiplexer 100, multiplexer 200 and buffer 300.

Thus, in response to third selection signal S3 being logic high, circuit path(s) is(are) selected or enabled to provide third buffer input pair B3, NB3 to MUXC output pair QO, NQO while other circuit paths are unselected, disabled or shut down to maximize isolation.

When first and second control signals B1, B2 are 11, OHC logic table indicates only fourth selection signal S4 is logic high. As a result, output multiplexer MUXC has selected the output of second buffered multiplexer BMUXB, i.e., second mux output pair QB, NQB, to provide to MUXC output pair QO, NQO. Fourth selection signal S4 selects the output of fourth buffer BUF4, i.e., fourth buffer output pair R4, NR4, to provide to second mux output pair QB, NQB. Thus, fourth buffer BUF4 provides fourth buffer input pair B4, NB4 to fourth buffer output pair R4, NR4. Fourth mux input pair A4, NA4 receives fourth buffer output pair R4, NR4. Second multiplexer MUXB provides fourth mux input pair A4, NA4 to second mux output pair QB, NQB. Output multiplexer MUXC receives second mux output pair QB, NQB at MUXB input pair B, NB and provides it to MUXC output pair QO, NQO.

With first, second and third selection signals S1, S2, S3 being logic low, first buffer BUF1, second buffer BUF2 and first multiplexer MUXA in first buffered multiplexer BMUXA may be disabled as described with respect to one or more disabling techniques for multiplexer 100, multiplexer 200 and buffer 300. Also, third buffer BUF3 and the first input circuit in second multiplexer MUXB coupled to third mux input pair A3, NA3 may be disabled as described with respect to one or more disabling techniques for multiplexer 100, multiplexer 200 and buffer 300.

Thus, in response to fourth selection signal S4 being logic high, circuit path(s) is(are) selected or enabled to provide fourth buffer input pair B4, NB4 to MUXC output pair QO, NQO while other circuit paths are unselected, disabled or shut down to maximize isolation.

In other embodiments, the core multiplexer ratio of 2:1 in multiplexer 100, multiplexer 200, buffered multiplexer 400, buffered multiplexer 500 and any other embodiments may be extended to N:1, where N is greater than two, without increasing cascoding levels by implementing control with one-hot coding. In contrast, conventional N:1 multiplexers require $\log_2(N)+1$ cascoding levels. In some embodiments, a 2n:1 high isolation multiplexer can be constructed using 2n buffers, $2^{(n-1)}$ multiplexers in a first stage coupled to buffers, $2^{(n-i)}$ multiplexers in an intermediate (i) multiplexer stage tree and one 2:1 multiplexer in a final multiplexer stage.

Also in other embodiments, rather than shunting current sources, one or more current sources may be shut down, e.g., by disabling current sources or otherwise powering down buffer or multiplexer building blocks in a circuit where appropriate.

V. Exemplary Methods

Embodiments may also be implemented in processes or methods. Embodiments described with respect to FIGS. 1-5 and other embodiments in accordance with the technical subject matter described herein may operate according to methods presented herein and other methods within the scope of the technology disclosed herein.

Figure 6:
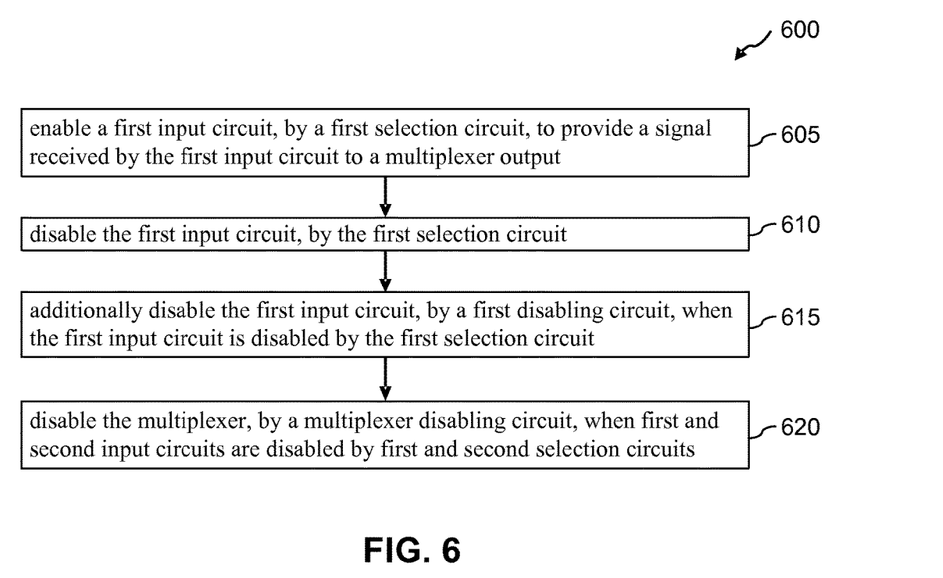
FIG. 6 illustrates an exemplary method of operating an exemplary high speed, low power, isolated multiplexer in accordance with an embodiment of the invention.

FIG. 6 illustrates an exemplary method of operating an exemplary high speed, low power, isolated multiplexer in accordance with an embodiment of the invention. Method 600 begins at step 605, where a first input circuit is enabled by a first selection circuit to provide a signal received by the first input circuit to a multiplexer output. For example, as shown in FIGS. 1 and 2, when selection signal S is logic high (i.e. logic 1) and inverted selection signal NS is logic low (i.e. logic 0), current flows through NMOS 8, thereby enabling current to flow in the first differential input circuit comprising BJT 4 and BJT 5, resulting in the selection of first differential input A1, NA1 to be provided to differential output Q, NQ.

In step 610, the first input circuit is disabled by the first selection circuit. For example, as shown in FIGS. 1 and 2, when selection signal S is logic low (i.e. logic 0) and inverted selection signal NS is logic high (i.e. logic 1), current flow is disabled through NMOS 8, thereby disabling the first differential input circuit comprising BJT 4 and BJT 5. Instead, current flows through NMOS 9, thereby selecting second differential input A0, NA0 to be provided to differential output Q, NQ.

In step 615, the first input circuit is additionally disabled by a first disabling circuit when the first input circuit is disabled by the first selection circuit. For example, as shown in FIGS. 1 and 2, when selection signal S is logic low (i.e. logic 0) and inverted selection signal NS is logic high (i.e. logic 1), current flow is disabled through NMOS 8, thereby disabling the first differential input circuit comprising BJT 4 and BJT 5. With selection signal S being logic low, the first differential input circuit comprising BJT 4 and BJT 5 is additionally disabled by the first disabling circuit comprising PMOS 11 turning on and pulling common emitter NODE B up towards voltage source VDD.

In step 620, multiplexer is disabled by a buffer disabling circuit when first and second input circuits are disabled by first and second selection circuits. For example, as shown in FIG. 2, when both independent first and second input selection control signals SA, SB are logic 0 the multiplexer disabling circuit comprising PMOS 13 is turned on. When PMOS 13 is on, it additionally disables the first and second differential input circuits and disables the multiplexer 200 by short-circuiting the first series circuit formed by the first input circuit and first selection circuit and the second series circuit formed by the second input circuit and second selection circuit, including any parasitic overlap capacitance therein. Depending on the implementation, PMOS 13 may pull the collector node of current source BJT 10 up towards voltage source VDD. Also, when PMOS 13 is on, current may be shunted through PMOS 13 to the current source.

Other embodiments may comprise other, alternative and/or additional steps. For example, without limitation, an additional step may comprise enabling a buffer input circuit, by a buffer selection circuit, to provide a signal received by the buffer input circuit to the first input circuit of the multiplexer; disabling the buffer input circuit, by the buffer selection circuit; additionally disabling the buffer input circuit, by the buffer input disabling circuit; and disabling the buffer, by the buffer disabling circuit, when the input circuit is disabled by the selection circuit. These steps are addressed in FIG. 7.

Figure 7:
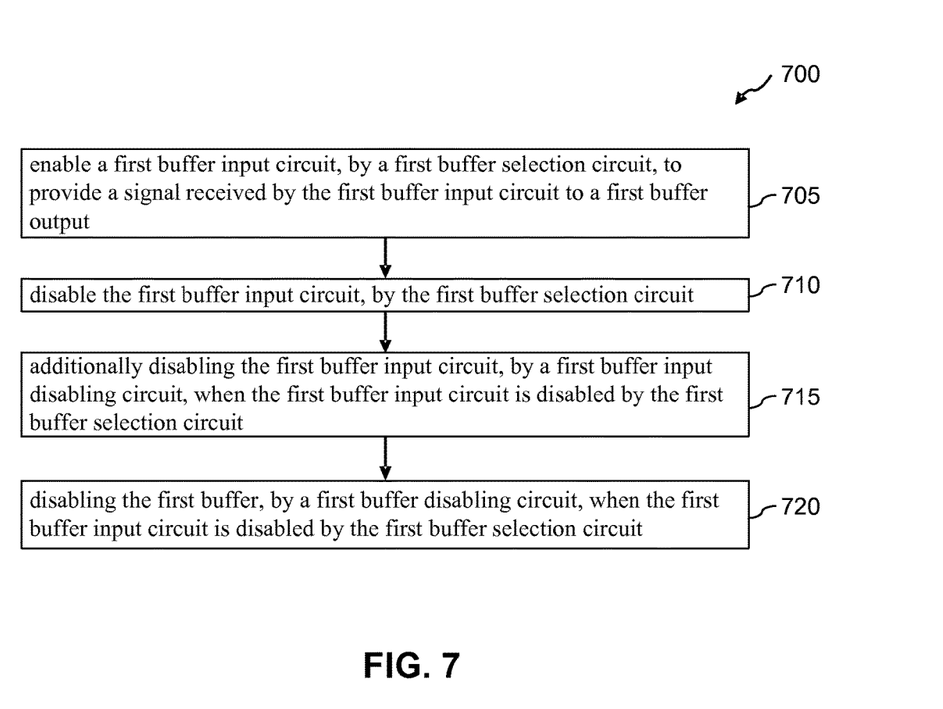
FIG. 7 illustrates an exemplary method of operating an exemplary high speed, low power, isolated buffer in accordance with an embodiment of the invention.

FIG. 7 illustrates an exemplary method of operating an exemplary high speed, low power, isolated buffer in accordance with an embodiment of the invention. Method 700 begins at step 705, where a first buffer input circuit is enabled by a first buffer selection circuit to provide a signal received by the first buffer input circuit to a first buffer output. For example, as shown in FIG. 3, when selection signal S is logic high (i.e. logic 1), current flows through the first buffer selection circuit comprising NMOS 21, thereby enabling current to flow in the first buffer input circuit comprising BJT 17 and BJT 18, resulting in the selection of first buffer input signal B, NB to be provided to first buffer output R, NR.

In step 710, the first buffer input circuit is disabled by the first buffer selection circuit. For example, as shown in FIG. 3, when selection signal S is logic low (i.e. logic 0), current flow is disabled through NMOS 21, thereby disabling the first buffer input circuit comprising BJT 17 and BJT 18.

In step 715, the first buffer input circuit is additionally disabled by a first buffer input disabling circuit when the first buffer input circuit is disabled by the first buffer selection circuit. For example, as shown in FIG. 3, when selection signal S is logic low (i.e. logic 0), current flow is disabled through NMOS 21, thereby disabling the first buffer input circuit comprising BJT 17 and BJT 18. With selection signal S being logic low, the first buffer input circuit comprising BJT 17 and BJT 18 is additionally disabled by the first buffer input disabling circuit comprising PMOS 20 turning on and pulling common emitter NODE C up towards voltage source VDD.

In step 720, the first buffer is disabled by a buffer disabling circuit when the first buffer input circuit is disabled by the first buffer selection circuit. For example, as shown in FIG. 3, when selection signal S is logic 0 the buffer disabling circuit comprising PMOS 22 is turned on. When PMOS 22 is on, it disables the buffer 300 by short-circuiting the series circuit formed by the first buffer input circuit and first buffer selection circuit, including any parasitic overlap capacitance therein. Depending on the implementation, PMOS 22 may pull the collector node of current source BJT 19 up towards voltage source VDD. Also, when PMOS 22 is on, current may be shunted through PMOS 22 to the current source. In some embodiments, PMOS 22 may be a relatively small device. This additional disabling of buffer 300 reduces coupling, which improves the isolation of buffer 300.

Other embodiments may comprise other, alternative and/or additional steps. For example, without limitation, an additional step may comprise controlling the buffer input selection circuit, the buffer input disabling circuit and the buffer disabling circuit by asserting a common control coupled to the buffer input selection circuit, the buffer input disabling circuit and the buffer disabling circuit. For example, as shown in FIG. 3, selection signal S is coupled to and controls the buffer input selection circuit comprising NMOS 21, the buffer input disabling circuit comprising PMOS 20 and the buffer disabling circuit comprising PMOS 22.

Methods presented herein are only a few of many possible methodological embodiments. Other structural and operational embodiments will be apparent to persons skilled in the relevant art(s) based on the foregoing discussion of embodiments. There is no requirement that a method embodiment implement all of the steps illustrated or discussed. Embodiments may implement fewer, more or different steps with and without a particular order.

VI. Conclusion

Methods and apparatuses have been disclosed for a high speed, low power, isolated multiplexer having architecture and operation that control current flow to minimize coupling and power consumption. Multiplexer architecture may include one or more of BiCMOS components, an input disabling circuit operated to additionally disable an input circuit when it is also disabled by a selection circuit, a multiplexer disabling circuit operated to disable a multiplexer when input circuits are disabled by the selection circuit, a buffer having a buffer input disabling circuit operated to additionally disable a buffer input circuit when it is also disabled by a buffer selection circuit and a buffer disabling circuit operated to disable a buffer when the buffer input circuit is disabled by the buffer selection circuit. Any one or more of these features may be implemented in an embodiment.

Methods and apparatuses have been disclosed for a high speed, low power, isolated buffer having architecture and operation that control current flow to minimize coupling and power consumption has been disclosed. Buffer architecture may include one or more of BiCMOS components, an input disabling circuit operated to additionally disable an input circuit when it is also disabled by a selection circuit and a buffer disabling circuit operated to disable the buffer when the input circuit is disabled by the selection circuit. The selection circuit, input disabling circuit and buffer disabling circuit may be operated by the same control signal. Any one or more of these features may be implemented in an embodiment.

There are performance advantages provided by embodiments of the disclosed technology relative to conventional technology. For example, without limitation, isolation and/or power consumption performance may be improved in apparatus and method embodiments of the disclosed technology.

There are no limitations on application of embodiments. Embodiments may be used in any multiplexer, buffer application or any other application not involving a buffer or multiplexer where isolation and/or power consumption performance may be improved by implementing the disclosed technology. For example, without limitation, communication, systems, timing systems, clock distribution networks, multiple clock input systems and high frequency signal or clock circuits may be improved by the disclosed technology. In greater detail, again without limitation, systems with multiple clocks having different frequencies and phases that may be selected to drive a system may benefit from embodiments of the disclosed technology to improve isolation and/or to improve power consumption by reducing or eliminating current leaks, residue or other undesired current flow in unselected or undesired paths, which may reduce coupling and noise.

Proper interpretation of subject matter described herein and claimed hereunder is limited to patentable subject matter under 35 U.S.C. § 101. Subject matter described in and claimed based on this patent application is not intended to and does not encompass unpatentable subject matter. As described herein and claimed hereunder, a method is a process defined by 35 U.S.C. § 101. As described herein and claimed hereunder, each of a circuit, device, apparatus, machine, system, computer, module, media and the like is a machine and/or manufacture defined by 35 U.S.C. § 101.

A device may comprise, for example but not limited to, a buffer, multiplexer, clock distribution circuit, communication circuit and any other device that may implement the disclosed technology. A device (i.e., apparatus), as defined herein, is a machine or manufacture as defined by 35 U.S.C. § 101. Devices may be digital, analog or a combination thereof. Devices may be implemented with any one or more semiconductor processes or semiconductor technology, including one or more of BJT, HBT, MOSFET, MESFET, CMOS, BiCMOS or other transconductor or transistor technology. Implementation with different technologies may require alternative configurations other than the configuration illustrated in embodiments presented herein, which is within the knowledge of one of ordinary skill. Devices may be implemented in any discrete or integrated circuit fabrication technology, including but not limited to Silicon-Germanium (SiGe) semiconductors or other semiconductors comprising other materials and alloys.

Techniques described herein may be implemented in hardware (digital and/or analog) or a combination of hardware, software and/or firmware. Techniques described herein may be implemented in one or more components. Embodiments of the invention may comprise computer program products comprising logic (e.g., in the form of program code or software as well as firmware) stored on any computer useable medium, which may be integrated in or separate from other components. Such program code, when executed in one or more processors, causes a device to operate as described herein. Devices in which embodiments may be implemented may include storage, such as storage drives, memory devices, and further types of computer-readable media. Examples of such computer-readable media include, but are not limited to, a hard disk, a removable magnetic disk, a removable optical disk, flash memory cards, digital video disks, random access memories (RAMs), read only memories (ROM), and the like. In greater detail, examples of such computer-readable media include, but are not limited to, a hard disk associated with a hard disk drive, a removable magnetic disk, a removable optical disk (e.g., CDROMs, DVDs, etc.), zip disks, tapes, magnetic storage devices, MEMS (micro-electromechanical systems) storage, nanotechnology-based storage devices, as well as other media such as flash memory cards, digital video discs, RAM devices, ROM devices, and the like. Such computer-readable media may, for example, store computer program logic, e.g., program modules, comprising computer executable instructions that, when executed, provide and/or maintain one or more aspects of functionality described herein with reference to FIGS. 1-7, as well as any and all components, steps and functions therein and/or further embodiments of the present technology described herein.

While the disclosed technology has been described with respect to a limited number of embodiments, it should be understood that they have been presented by way of example only, and not limitation. It will be understood by those skilled in the relevant art(s) that the spirit and scope of the subject matter of the present application encompasses a wide variety of implementations, including various changes in form and details to disclosed embodiments.

Embodiments are not limited to the functional blocks, detailed examples, steps, order or the entirety of subject matter presented in the figures, which is why the figures are referred to as exemplary embodiments. An embodiment in a device, apparatus or machine may comprise any one or more features described herein in any configuration. An embodiment in a method may comprise any process described herein, in any order, with any number of steps, using any modality.

The exemplary appended claims encompass embodiments and features described herein, modifications and variations thereto as well as additional embodiments and features that fall within the true spirit and scope of this present invention.

What is claimed:

1. A buffer comprising:
an input circuit that receives an input signal;
a selection circuit that enables and disables operation of the input circuit;
an input disabling circuit that simultaneously disables operation of the input circuit also disabled by the selection circuit, wherein the input circuit is operable when enabled and inoperable when disabled and wherein the input disabling circuit is distinct from the selection circuit; and
a buffer disabling circuit that disables the buffer when the input circuit is disabled by the selection circuit.

2. The buffer of claim 1, further comprising:
a current source.

3. The buffer of claim 2, wherein the selection circuit, input disabling circuit and buffer disabling circuit are coupled to the same control.

4. The buffer of claim 3, wherein the input circuit comprises a bipolar transistor and the selection circuit, input disabling circuit and buffer disabling circuit comprise MOSFET transistors.

5. The buffer of claim 3, wherein the input circuit and selection circuit are coupled in series forming a series circuit, the input disabling circuit is coupled in parallel with the input circuit and the buffer disabling circuit is coupled in parallel with the series circuit.

6. The buffer of claim 5, further comprising:
a load resistor coupled in the series circuit.

7. The buffer of claim 4, wherein the selection circuit is controllable to create an open circuit to the current source and the input disabling circuit is controllable to lock the bipolar transistor in the input circuit in cut-off mode.

8. The buffer of claim 7, wherein:
the selection circuit comprises a selection transistor having a gate node coupled to a control;
the input circuit comprises an input transistor having a base node coupled to the input signal, a collector node coupled to a buffer output and an emitter node coupled to a drain node of the selection transistor; and
the input disabling circuit comprises an input disabling transistor having a gate node coupled to the control, a source node coupled to a voltage supply and a drain node coupled to the drain node of the selection transistor.

9. The buffer of claim 8, wherein:
the current source comprises a current source transistor having a collector node coupled to a source node of the selection transistor; and
the buffer disabling circuit comprises a gate node coupled to the control, a source node coupled to the voltage source and a drain node coupled to the collector of the current source transistor.

10. A device comprising a buffer, the buffer comprising:
an input circuit that receives an input signal;
a selection circuit that enables and disables operation of the input circuit;
an input disabling circuit that simultaneously disables operation of the input circuit that is also disabled by the selection circuit, wherein the input circuit is operable when enabled and inoperable when disabled and wherein the input disabling circuit is distinct from the selection circuit; and a buffer disabling circuit that disables the buffer when the input circuit is disabled by the selection circuit.

11. The device of claim 10, the buffer further comprising: a current source.

12. The device of claim 11, wherein the selection circuit, input disabling circuit and buffer disabling circuit are coupled to the same control.

13. The device of claim 12, wherein the input circuit comprises a bipolar transistor and the selection circuit, input disabling circuit and buffer disabling circuit comprise MOSFET transistors.

14. The device of claim 12, wherein the input circuit and input disabling circuit are coupled between a voltage source and the selection circuit, the selection circuit is coupled between the disabling circuit and the current source and the buffer disabling circuit is coupled between the voltage source and the current source.

15. The device of claim 13, wherein the selection circuit is controllable to create an open circuit to the current source and the disabling circuit is controllable to lock the bipolar transistor in the input circuit in cut-off mode.

16. The device of claim 15, wherein:
the selection circuit comprises a selection transistor having a gate node coupled to a control;
the input circuit comprises an input transistor having a base node coupled to the input signal, a collector node coupled to a buffer output and an emitter node coupled to a drain node of the selection transistor; and
the input disabling circuit comprises a disabling transistor having a gate node coupled to the control, a source node coupled to a voltage supply and a drain node coupled to the drain node of the selection transistor.

17. The device of claim 16, wherein:
the current source comprises a current source transistor having a collector node coupled to a source node of the selection transistor; and
the buffer disabling circuit comprises a buffer disabling transistor having a gate node coupled to the control, a source node coupled to the voltage source and a drain node coupled to the collector of the current source transistor.

18. A method of operating a buffer comprising:
enabling operation of an input circuit, by a selection circuit;
disabling operation of the input circuit, by the selection circuit;
simultaneously disabling operation of the input circuit, by an input disabling circuit when the input circuit is disabled by the selection circuit, wherein the input circuit is operable when enabled and inoperable when disabled and wherein the input disabling circuit is distinct from the selection circuit; and
disabling the buffer, by a buffer disabling circuit, when the input circuit is disabled by the selection circuit.

19. The method of claim 18, further comprising:
controlling a variable current source with a variable current source control signal.

20. The method of claim 19, further comprising:
controlling the selection circuit, the input disabling circuit and the buffer disabling circuit with a common control coupled to the selection circuit, the input disabling circuit and the buffer disabling circuit.

* * * * *